United States Patent [19]

Mazoyer et al.

[11] Patent Number: 5,455,539
[45] Date of Patent: Oct. 3, 1995

[54] DEVICE FOR REGULATING THE COMMON MODE VOLTAGE AT THE OUTPUT OF A BALANCED AMPLIFIER

[75] Inventors: Yves Mazoyer; Thierry Fensch, both of Grenoble, France

[73] Assignee: SGS-Thomson Microelectronics S.A., Saint-Genis, France

[21] Appl. No.: 197,350

[22] Filed: Feb. 16, 1994

[30] Foreign Application Priority Data

Feb. 26, 1993 [FR] France .................... 93 02616

[51] Int. Cl.$^6$ ...................................... H03F 3/45
[52] U.S. Cl. ........................................ 330/258; 330/261
[58] Field of Search .......................... 330/252, 253, 330/257, 258, 261

[56] References Cited

U.S. PATENT DOCUMENTS

| | | | |
|---|---|---|---|
| 3,444,476 | 5/1969 | Leidich | 330/252 |
| 4,667,165 | 5/1987 | De Weck | 330/253 |
| 4,904,953 | 2/1990 | McCormack | 330/258 |
| 5,187,448 | 2/1993 | Brooks et al. | 330/258 |

FOREIGN PATENT DOCUMENTS 1238961  4/1967  Germany .

OTHER PUBLICATIONS

IEEE International Solid State Circuits Conference, vol. 34, Feb. 1991, New York, pp. 278–329, G. Nicollini, et al., "A–78dB THD 100 Ohm Differential Driver For ISDN Applications".

Primary Examiner—Steven Mottola
Attorney, Agent, or Firm—Wolf, Greenfield & Sacks

[57] ABSTRACT

A device for regulating the common mode output voltage of a balanced amplifier having two differential outputs, including a differential stage providing a correction signal of the common mode voltage corresponding to the difference between a reference voltage and the average differential output voltage of the amplifier, and further including a current generator that sets a polarization current of the differential stage, the current generator being controlled by the output current of the balanced amplifier.

17 Claims, 3 Drawing Sheets

DEVICE FOR REGULATING THE COMMON MODE VOLTAGE AT THE OUTPUT OF A BALANCED AMPLIFIER

BACKGROUND OF THE INVENTION

1. Field of the Invention

The present invention relates to balanced differential amplifiers, that is, to amplifiers having two differential outputs, a first signal and a second signal, the two signals being in phase opposition.

The invention more particularly relates to a device for regulating the common mode voltage at the output of such an amplifier.

2. Discussion of the Related Art

Balanced amplifiers are used when a high variation of output voltage (output dynamic) is needed, but when only a low supply voltage is available.

FIG. 1 schematically represents a balanced amplifier 10. Amplifier 10 includes two differential amplifiers 12 and 13, each powered by a high voltage Vcc and a low voltage GND. The outputs of amplifiers 12 and 13 form the differential outputs of the balanced amplifier 10. The inverting inputs of the differential amplifiers 12 and 13 connect to differential input terminals, E+ and E−, respectively.

The common mode voltage VCM at the output of amplifier 10, that is, the average of the output voltages of amplifiers 12 and 13, may vary. A first cause of variation is a change in the common mode voltage at the input, which occurs, for example, if the voltages at terminals E+ and E− are not symmetric with respect to a fixed common mode reference voltage. A second, systematic, cause of variation is a change in the characteristics of the N-type and P-type transistors that form amplifier 10.

A high variation of voltage VCM with respect to a reference value, (Vcc+GND)/2, for example, can cause clipping of the output signals of amplifier 10, particularly if the output signal amplitude is close to its maximum value. For this reason, it is desirable to regulate the output common mode voltage VCM.

FIG. 1 shows a conventional device for regulating the common mode output voltage of a balanced differential amplifier. This device includes a corrector differential amplifier 15, whose output connects to the non-inverting inputs of amplifiers 12 and 13. The inverting input of corrector amplifier 15 receives VCM, the mean value of the output voltages of amplifiers 12 and 13, through a pair of resistors 17 and 18 having the same resistance value. The non-inverting input of corrector amplifier 15 receives a reference voltage $VCM_0$, the value with respect to which the corrector amplifier 15 regulates the common mode voltage VCM.

With this configuration, any resulting common mode errors, that is, differences between voltage VCM and voltage $VCM_0$, are inversely proportional to the gain of the corrector amplifier 15. Thus, errors are minimized if the gain is very high.

Conventionally, since regulation must be stable and fast, amplifier 15 comprises a single differential stage.

In order to limit the power consumption of this stage, its polarization current is chosen to be low. However, low polarization current causes the stage to saturate for high values of common mode error. When saturation occurs, the gain of the differential stage significantly drops, thus impairing the stages ability to correct high common mode errors.

Since the polarization current of the stage is chosen to be low, the stage rapidly saturates. Thus, there is a trade-off in the prior art between low power consumption in corrector amplifier 15 and high common mode voltage correction range.

SUMMARY OF THE INVENTION

An object of the invention is to provide a device of the above described type for regulating the common mode voltage, but with a corrector differential stage having a high correction range and a low mean power consumption, thus obviating the trade-off found in the prior art.

Another object of the invention is to provide such a regulation device in which the differential stage does not risk to saturate.

A further object of the invention is to provide a particularly simple regulation device.

The invention is based on the observation that common mode errors mostly vary in phase (or in phase opposition) with the output current of amplifier 10. To achieve the above-mentioned objects, the invention provides a regulation device in which the polarization current of the corrector differential stage is adjusted in proportion to the output current of the amplifier.

With such a device, the polarization current of the corrector differential stage remains low in the presence of a small amplifier output signal, but rises in the presence of a large amplitude signal. The corrector amplifier can thus minimize common mode errors with the same effectiveness, regardless of whether they occur in the presence of small or large amplitude signals. Additionally, since the polarization current of the corrector stage follows its input voltage (the common mode error), over time, the stage does not risk to saturate.

A specific implementation of the device using current mirrors enables the device to be particularly simple.

The invention more particularly aims at providing a device for regulating the common mode output voltage of a balanced amplifier having two differential outputs, the device including a differential stage providing a correction signal of the common mode voltage corresponding to the difference between a reference voltage and the average differential output voltage of the amplifier, and further including a current generator setting the polarization current of the differential stage. According to the invention, the current generator is controlled by the output current of the balanced amplifier.

According to an embodiment of the invention, the balanced amplifier includes two output stages, each comprising two current mirrors, a first current mirror and a second current mirror, having opposite polarities and whose outputs are connected together. The differential stage provides an additional correction current, with an appropriate polarity, to the input current of one of the two current mirrors.

According to an embodiment of the invention, the current generator setting the polarization current of the differential stage includes a current mirror that replicates, possibly with a multiplying factor, the output current of the first current mirror.

According to an embodiment of the invention, the differential stage includes an output branch that is connected to the input of a current mirror having its output parallel-connected to the input of the first current mirror.

According to an embodiment of the invention, the current mirror providing the polarization current to the differential stage is controlled by a second output of the first current mirror, the first output of the first current mirror being the output that is connected to the output of the second current mirror of the output stage.

The foregoing and other objects, features, aspects and advantages of the invention will become apparent from the following detailed description of the present invention when taken in conjunction with the accompanying drawings.

DETAILED DESCRIPTION

Figure 1:
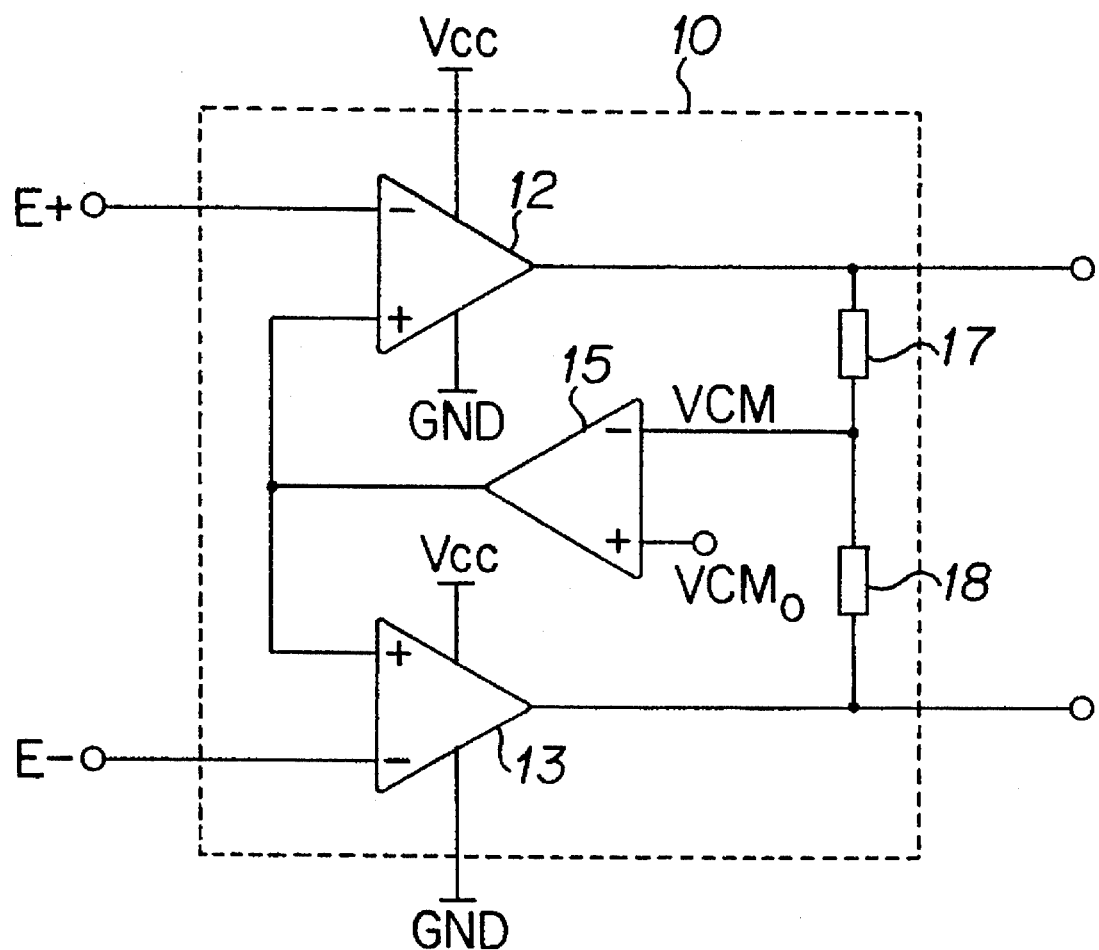
FIG. 1 above described, schematically represents a balanced amplifier provided with a conventional device for regulating the common mode voltage at the amplifier output.
Figure 2:
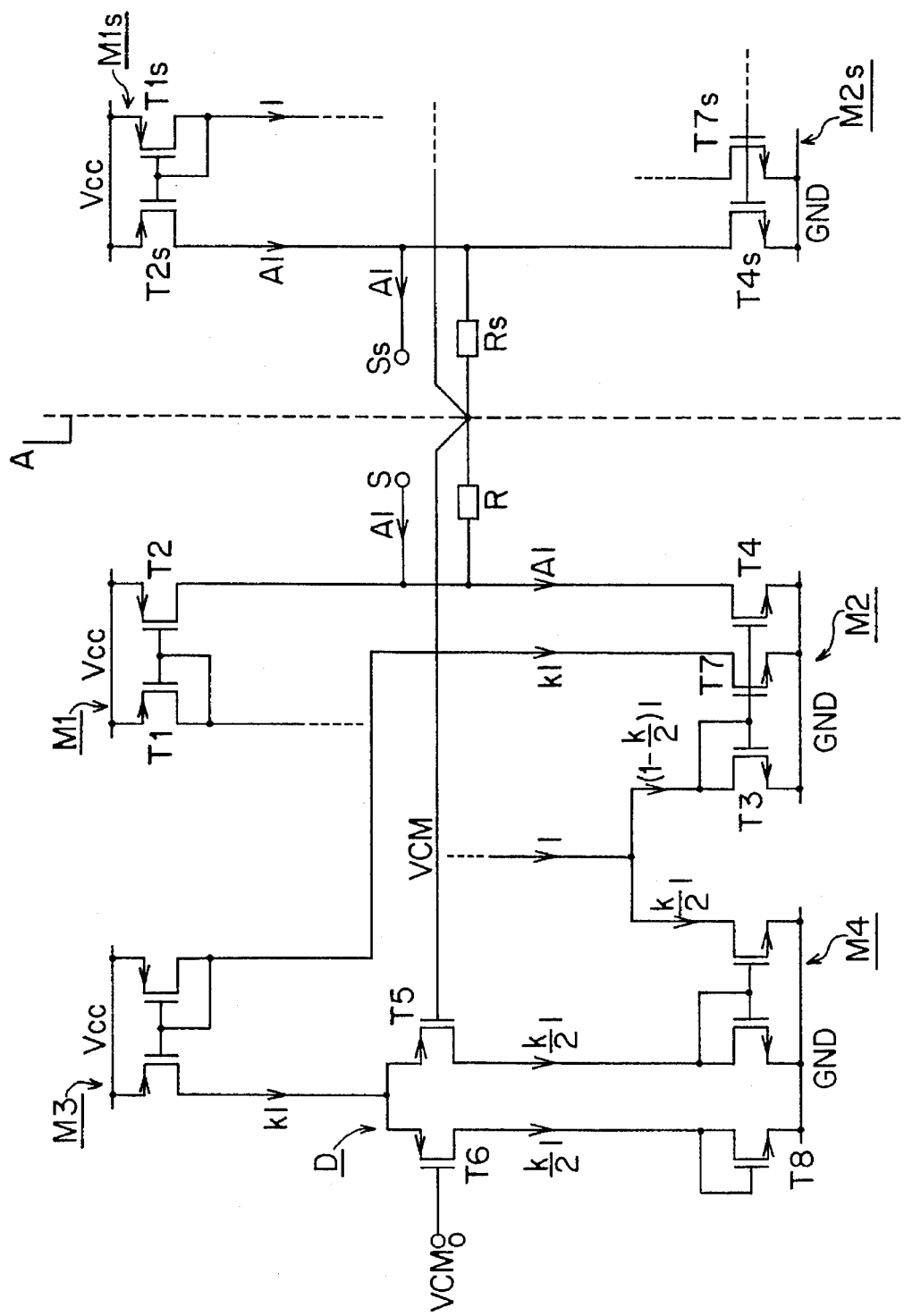
FIG. 2 is a schematic half view of an embodiment of the regulation device according to the invention, inserted in a conventional amplifier output stage.

The regulation device according to the invention is particularly easily adapted to a specific type of amplifier output stage, as shown in FIG. 2.

FIG. 2 shows, to the left of symmetry axis A, a first output stage providing a first output of a balanced amplifier. The second output of the balanced amplifier is provided by a stage symmetric to the first stage with respect to axis A. Each element described hereinafter on one side of axis A has a symmetric counterpart (not shown) on the other side of axis A, designated with a same reference, but bearing index "s".

The first output stage includes a current mirror M1, connected to a high voltage Vcc, and a current mirror M2, connected to a low voltage GND. Hereinafter, a current mirror connected to a high voltage is referred to as a positive polarity mirror, and a current mirror connected to a low voltage is referred to as a negative polarity mirror. The positive polarity mirror M1 includes a P-channel MOS input transistor T1, whose source connects to Vcc, and whose gate and drain connect together. The drain of transistor T1 forms the input of mirror M1. Mirror M1 includes a P-channel MOS output transistor T2, whose source connects to voltage Vcc and whose gate connects to the gate of transistor T1. The drain of transistor T2 forms the output of mirror M1. A negative polarity current mirror has the same configuration as the above described positive polarity mirror M1, except that its transistors are N-channel and the sources of these transistors are connected to the low voltage GND. Current mirror M2 includes an input N-channel MOS transistor T3, and a first output N-channel MOS transistor T4. The outputs of current mirrors M1 and M2 (drains of transistors T2 and T4) are connected to an output terminal S of the balanced amplifier.

To inject a current of a first polarity into a load connected between the output terminals S and Ss, a conventional control stage (not shown) provides to the inputs of current mirrors M1 and M2s currents of opposite polarities. To inject a current AI of a second polarity into the load, currents I of opposite polarities are provided, as shown in FIG. 2, to the inputs of current mirrors M1s and M2.

A pair of resistors, R and Rs, of equal value, is disposed between the output terminals S and Ss. The output common mode voltage VCM of the amplifier is obtained at the junction between resistors R and Rs. Voltage VCM is applied to the gate of a first transistor T5 of a differential stage D. A second transistor T6 of the differential stage D, having its source connected to the source of transistor T5, receives at its gate a constant reference voltage $VCM_0$, that is the desired common mode voltage to be maintained at the amplifier output. In the example of FIG. 2, T5 and T6 are P-channel MOS transistors.

According to the invention, the current mirror M2 includes a second output transistor T7, having its gate and source connected to the gate and source, respectively, of transistor T4, and whose drain current kI constitutes the polarization current of the differential stage D. For this purpose, the sources of transistors T5 and T6 are connected to the output of a positive polarity current mirror M3, that receives as its input the drain current of transistor T7. Additionally, the input current $(1-K/2)I$, of current mirror M2, is partially derived by the output of a negative polarity current mirror M4, whose input receives current from the drain of transistor T5 of the differential stage D.

With this configuration, if the common mode voltage VCM varies (for example increases) with respect to the reference voltage $VCM_0$, the drain current of transistor T5 decreases, as does the current derived by the output of current mirror M4. Thus, the input current of current mirror M2 increases, and the output transistor T4 of current mirror M2 becomes more conductive, decreasing the voltage at terminal S and therefore decreasing the common mode voltage VCM.

Since the drain current of transistor T7 is proportional to the drain current of transistor T4 (the output current AI), the polarization current of the differential stage D is proportional to the output current AI. Thus, the differential stage D does not risk to saturate, as the whole polarization current kI no longer flows through one only of transistors T5 and T6 when the difference between VCM and $VCM_0$ becomes significant.

Additionally, the polarization current kI of the differential stage D sets the maximum linear range of this stage, that is, the maximum variation in drain current of transistor T5 with respect to a variation in common mode error, $VCM-VCM_0$. For a MOS-transistor stage, the maximum linear range is proportional to the polarization current. Thus, the higher the output current of the amplifier (i.e., the higher the risk of common mode error) the more effective the compensation for common mode error.

The symmetric counterpart (not shown) of the differential stage D similarly acts upon the current mirror M2s when a control circuit (not shown) stimulates current mirrors M1 and M2s to inject into the load a current −AI of opposite polarity.

The power consumption of the regulation device according to the invention is particularly low. In the absence of an output signal, the polarization current of the differential stage D and of its symmetric counterpart is zero. When an output signal is present, the differential stage D receives a polarization current only during even half-periods of the output signal (when mirrors M1s and M2 are active), and the symmetric differential stage receives a polarization current only during odd half-periods (when mirrors M1 and M2s are active). Additionally, the average polarization current of a stage is much lower than its maximum current.

Of course, the surfaces of the transistors of the current mirrors are chosen to adequately adjust the gains of the current mirrors, that is, the gain A for mirrors M1 and M1s, the gain $A/(1-k/2)$ between transistors T4 and T3 of mirror M2 (and between the symmetric transistors of mirror M2s), and the gain k/(1−k/2) between transistors T7 and T3 of mirror M2 (and between the symmetric transistors of current mirror M2s). Values A and k can be chosen by those skilled in the art to adapt the balanced amplifier according to the invention to meet desired requirements.

The drain of transistor T6 is connected to voltage GND through a load having the same characteristics as the input of current mirror M4 for the sake of symmetry. The load is, for example, an N-channel MOS transistor T8 having its source connected to voltage GND and its drain and gate connected to the drain of transistor T6.

Figure 3:
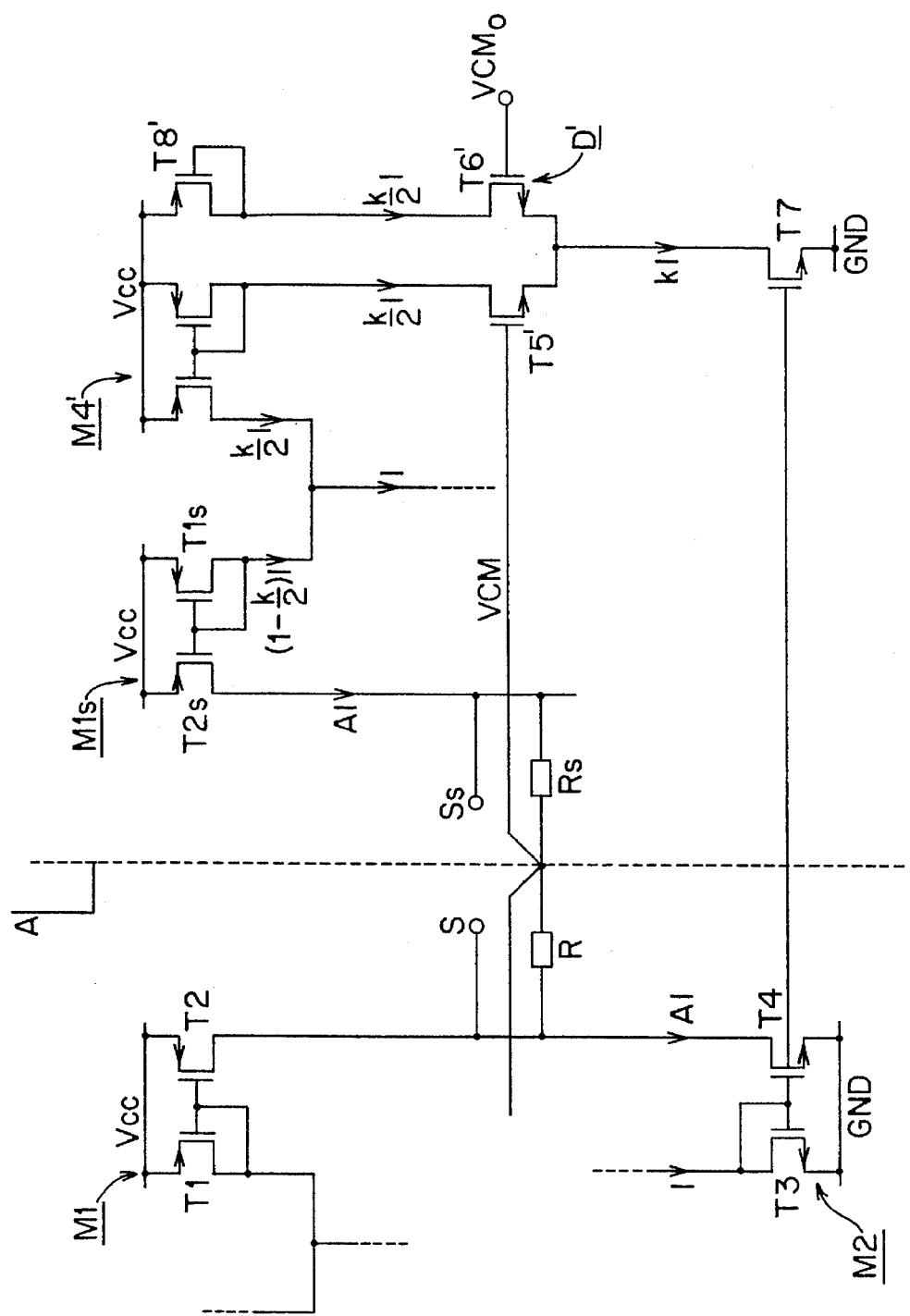
FIG. 3 is a schematic half view of an alternative embodiment of the regulation device according to the invention.

FIG. 3 schematically represents an alternative embodiment of the device for regulating the common mode voltage according to the invention. In FIG. 3, elements similar to those of FIG. 2 are designated with same references. FIG. 3 snows a circuit with a differential stage D' whose polarization current is set directly by the drain current of transistor T7 of current mirror M2. The differential stage D' includes N-channel MOS transistors T5' and T6', respectively, receiving at their gates voltages VCM and $VCM_0$. The drain of transistor T6' is connected to voltage Vcc through a load transistor T8', and the drain current of transistor T5' is derived from the control current I of current mirror M1s through a positive polarity current mirror M4'. Elements (not shown), symmetric to those described above, act upon mirror M1.

The circuit of FIG. 3 is theoretically equivalent to the circuit of FIG. 2 and allows one to eliminate the current mirror M3 of FIG. 2. However, in fact, the circuit of FIG. 2 is more efficient because it measures the output current (through transistor T7) on the same current mirror, M2, that is controlled by the differential stage D.

The complexity of the described embodiments of the device for regulating the common mode voltage is the same as, and even less than, that of the conventional regulating devices.

Although particularly advantageous embodiments aching on the amplifier output stages have been described, the invention also applies to circuits whose corrector stage acts on the amplifier input.

As is apparent to those skilled in the art, various modifications can be made to the above disclosed preferred embodiments. For example, the polarities of the transistors can be inverted, or bipolar transistors can be used.

Having thus described one particular embodiment of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is not intended as limiting. The invention is limited only as defined in the following claims and the equivalents thereto.

What is claimed is:

1. A device for regulating common mode voltage at the output of a balanced amplifier having two differential outputs, comprising:

a differential stage providing a correction signal of said common mode voltage corresponding to a difference between an average voltage value of the differential outputs and a reference voltage;

and a current generator setting a polarization current of the differential stage in proportion to a magnitude of an output current provided by at least one of the two differential outputs of the balanced amplifier.

2. A device for regulating common mode voltage at the output of a balanced amplifier having two differential outputs, comprising:

a differential stage providing a correction signal of said common mode voltage corresponding to a difference between an average voltage value of the differential outputs and a reference voltage;

and a current generator setting a polarization current of the differential stage, wherein the current generator is controlled by an output current of the balanced amplifier;

wherein the balanced amplifier includes two output stages, each comprising two current mirrors having opposite polarities and who outputs are connected together, and wherein said differential stage provides an additional correction current, having an appropriate polarity, to the input of the first of said two current mirrors.

3. A device for regulating common mode voltage at the output of a balanced amplifier having two differential outputs, comprising:

a differential stage providing a correction signal of said common mode voltage corresponding to a difference between an average voltage value of the differential outputs and a reference voltage; and a current generator setting a polarization current of the differential stage, wherein the current generator is controlled by an output current of the balanced amplifier;

wherein the balanced amplifier includes two output stages, each comprising two current mirrors having opposite polarities and whose outputs are connected together;

wherein said differential stage provides an additional correction current, having an appropriate polarity, to the input of a first of said two current mirrors; and wherein the current generator setting the polarization current of said differential stage includes a current mirror that replicates, with a multiplying factor, the output current of said first current mirror.

4. A device for regulating common mode voltage at the output of a balanced amplifier having two differential outputs, comprising:

a differential stage providing a correction signal of said common mode voltage corresponding to a difference between an average voltage value of the differential outputs and a reference voltage; and a current generator setting a polarization current of the differential stage, wherein the current generator is controlled by an output current of the balanced amplifier;

wherein the balanced amplifier includes two output stages, each comprising two current mirrors having opposite polarities and whose outputs are connected together;

wherein said differential stage provides an additional correction current, having an appropriate polarity, to the input of a first of said two current mirrors; and wherein the differential stage includes an output branch that is connected to the input of a current mirror having its output parallel-connected to the input of the first current mirror.

5. The regulation device of claim 3, wherein the current mirror providing the polarization current to the differential stage is controlled by a second output of the first current mirror, the first output of said first current mirror being the output that is connected to the output of the second current mirror of the output stage.

6. A device for regulating the common mode output voltage of a balanced differential amplifier, comprising:

a reference voltage corresponding to a desired common mode voltage; and two outputs of the balanced differential amplifier, each having an output voltage and an output current, an average value of the two output voltages comprising an actual common mode voltage;

wherein the two differential outputs have a load connected between them; and wherein each of the two differential outputs further comprises:

a differential stage having a polarization current, the differential stage producing an error current signal in response to a difference between the actual common mode voltage and the reference voltage, and in response to the polarization current;

an error-adjusting stage, having a reference current input, that produces an adjustment signal in response to a difference between the reference current input and the error current signal;

a bias-setting current stage that generates the polarization current in response to the adjustment signal;

an output stage that generates the output current in response to the adjustment signal, wherein the common mode voltage changes in response to the output current.

7. The device for regulating the common mode output voltage of a balanced amplifier as set forth in claim 6, wherein each of the two currents comprises a combined current of two current stages, a first current stage and a second current stage.

8. The device for regulating the common mode output voltage of a balanced amplifier as set forth in claim 7, wherein the circuit that adjusts the output current adjusts the first current stage.

9. The device for regulating the common mode output voltage of a balanced amplifier as set forth in claim 6, wherein the error current signal produced by the differential stage corresponds to a fraction of the polarization current and to a term directly related to the difference between the actual common mode voltage and the reference voltage.

10. The device for regulating the common mode output voltage of a balanced amplifier as set forth in claim 6, wherein the load connected between the two differential outputs comprises two resistors connected in series and having substantially equal resistance value, and wherein the actual common mode voltage is derived from a voltage at the junction of the two resistors.

11. The device for regulating the common mode output voltage of a balanced amplifier as set forth in claim 6, wherein only one of the two differential stages of the amplifier regulates the common mode voltage at a time.

12. The device for regulating the common mode output voltage of a balanced amplifier as set forth in claim 11, wherein only the one of the two differential stages regulating the common ode output conducts polarization current, the other differential stage having substantially zero polarization current.

13. The device for regulating the common mode output voltage of a balanced amplifier as set forth in claim 6, wherein the device is constructed of MOS transistors.

14. A device for regulating the common mode voltage at the output of a balanced differential amplifier having two output circuits, each of the two output circuits comprising:

a first differential circuit, having a voltage reference and a polarization current, that generates an error signal in response to a difference between the voltage reference and the common mode voltage and in response to a magnitude of the polarization current;

a second differential circuit, having a bias reference input, that generates a bias-setting signal in response to a difference between the bias reference input and the error signal;

a polarization stage that generates the polarization current for the first differential circuit in response to the bias-setting signal; and an output stage that generates an output current of the output circuit in response to the bias-setting signal, the common mode voltage changing in response to changes in the output current;

the output circuit thereby having two coupled control loops, an inner loop and an outer loop, the inner loop controlling the polarization current and the outer loop controlling the common mode voltage.

15. A device for regulating the common mode voltage at the output of a balanced differential amplifier having two output circuits, each of the two output circuits comprising:

means for generating a first difference signal, the means for generating operating in response to polarization means, and including a first reference means;

wherein the first difference signal is indicative of a difference between the first reference means and the common mode voltage, and further indicative of a magnitude of the polarization means;

a second reference means and means for generating a second difference signal indicative of a difference between the second reference means and the first difference signal;

bias-generating means for generating polarization means from the second difference signal; and output means for generating an output current from the second difference signal, the common mode voltage changing in response to changes in the output current;

the output circuit thereby having two coupled control loops, an inner loop and an outer loop, the inner loop controlling the polarization means and the outer loop controlling the common mode voltage.

16. A method for regulating the common mode voltage at the output of a balanced differential amplifier having two output circuits, each of the two output circuits producing an output current, wherein a change in the output current effects a change in the common mode voltage, each of the two circuits having a current reference, and each having a differential stage with a voltage reference as one input and the common mode voltage as another input, the differential stage having a polarization current, each of the two output circuits performing the steps of:

generating a first signal indicative of a difference between the voltage reference and the common mode voltage, and indicative of the polarization current;

generating a second signal indicative of a difference between the first signal and the current reference;

generating the polarization current from the second signal, the polarization current minimizing differences between the first signal and the current reference;

generating an output current of the output circuit from the second signal, the output current adjusting the common mode voltage and minimizing differences between the reference voltage and the common mode voltage.

17. A method for automatically adjusting a polarization current of a differential stage in each of two output circuits of a balanced differential amplifier that regulates a common mode voltage at its outputs, each output circuit having an output current, each stage performing the steps of:

generating a first difference signal equal to a fraction of the polarization current, and indicative of a difference between a first reference and the common mode voltage, the fraction of the polarization current decreasing for increasing difference between the first reference and the common mode voltage;

generating a second difference signal indicative of a difference between a second reference signal and the first difference signal;

generating the output current from the second difference signal, changes in the output current effecting changes in the common mode voltage and minimizing the difference between the first reference and the common mode voltage; and generating the polarization current from the second difference signal, the polarization current minimizing the difference between the reference current signal and the first difference signal;

therefore automatically adjusting the fraction of the polarization current to substantially equal the second reference, and therefore automatically adjusting the polarization current of the differential stage.

* * * * *